United States Patent
Lung et al.

(10) Patent No.: US 9,252,153 B1
(45) Date of Patent: Feb. 2, 2016

(54) METHOD OF WORD-LINE FORMATION BY SEMI-DAMASCENE PROCESS WITH THIN PROTECTIVE CONDUCTOR LAYER

(71) Applicant: Macronix International Co., Ltd., Hsinchu (TW)

(72) Inventors: Cheng-Yi Lung, Hsinchu (TW); An-Chyi Wei, Hsinchu (TW); Ta Hung Yang, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/493,021

(22) Filed: Sep. 22, 2014

(51) Int. Cl.
| | |
|---|---|
| H01L 29/66 | (2006.01) |
| H01L 29/76 | (2006.01) |
| H01L 27/088 | (2006.01) |
| H01L 27/115 | (2006.01) |
| H01L 29/51 | (2006.01) |
| H01L 21/768 | (2006.01) |
| H01L 21/311 | (2006.01) |
| H01L 21/3213 | (2006.01) |
| H01L 21/3205 | (2006.01) |
| H01L 29/423 | (2006.01) |
| H01L 29/792 | (2006.01) |
| H01L 23/528 | (2006.01) |

(52) U.S. Cl.
CPC .... H01L 27/11568 (2013.01); H01L 21/31111 (2013.01); H01L 21/32051 (2013.01); H01L 21/32053 (2013.01); H01L 21/32139 (2013.01); H01L 21/76802 (2013.01); H01L 21/76831 (2013.01); H01L 21/76877 (2013.01); H01L 23/528 (2013.01); H01L 29/4234 (2013.01); H01L 29/513 (2013.01); H01L 29/518 (2013.01); H01L 29/792 (2013.01)

(58) Field of Classification Search
CPC ............... H01L 27/11556; H01L 27/11568; H01L 27/11551; H01L 27/11565; H01L 27/11519; H01L 27/11578; H01L 27/105
USPC ............. 257/110, 213, 140, 173, 326, 392, 257/E29.309, 324, 635; 438/140, 328, 479, 438/587

See application file for complete search history.

(56) References Cited

U.S. PATENT DOCUMENTS

| | | | | |
|---|---|---|---|---|
| 2006/0292781 | A1* | 12/2006 | Lee | 438/197 |
| 2007/0018201 | A1* | 1/2007 | Specht et al. | 257/204 |
| 2007/0158736 | A1* | 7/2007 | Arai et al. | 257/315 |
| 2007/0267676 | A1* | 11/2007 | Kim et al. | 257/311 |
| 2009/0321816 | A1* | 12/2009 | Son et al. | 257/326 |
| 2012/0139030 | A1* | 6/2012 | Sakuma et al. | 257/326 |
| 2013/0015519 | A1* | 1/2013 | Fujii et al. | 257/324 |

* cited by examiner

*Primary Examiner* — Long K Tran
*Assistant Examiner* — Dzung Tran
(74) *Attorney, Agent, or Firm* — Stout, Uxa & Buyan, LLP; Frank J. Uxa

(57) ABSTRACT

A semi-damascene method is described for fabricating word-lines without stringers while maintaining critical cell dimensions when wordline pitch is less than 40 nm. A thin conducting layer protects a storage layer during manufacture, the thin conducting layer then making contact with filled-in conducting material.

8 Claims, 9 Drawing Sheets

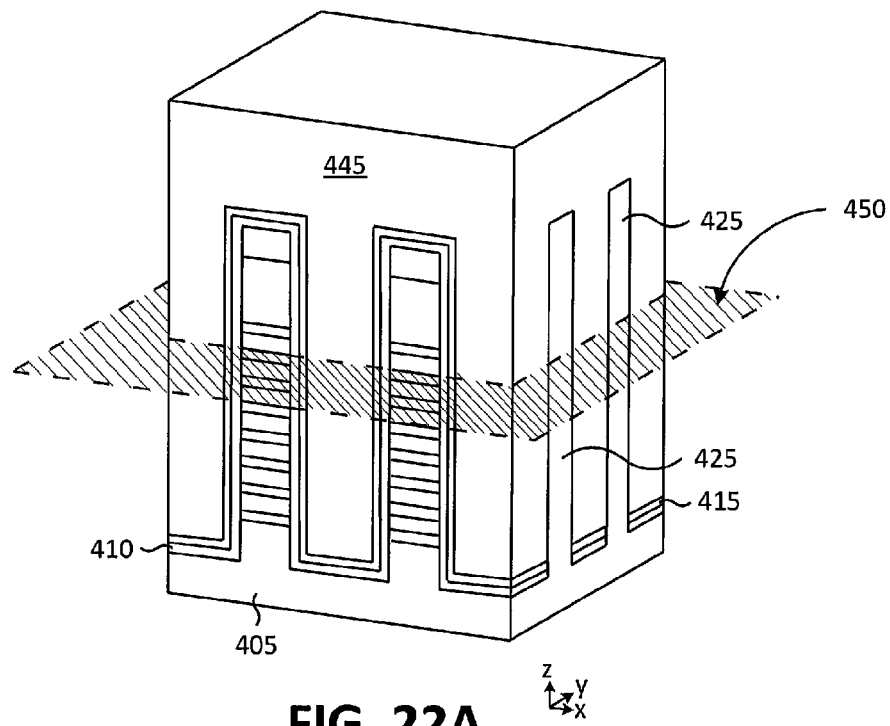
FIG. 22A
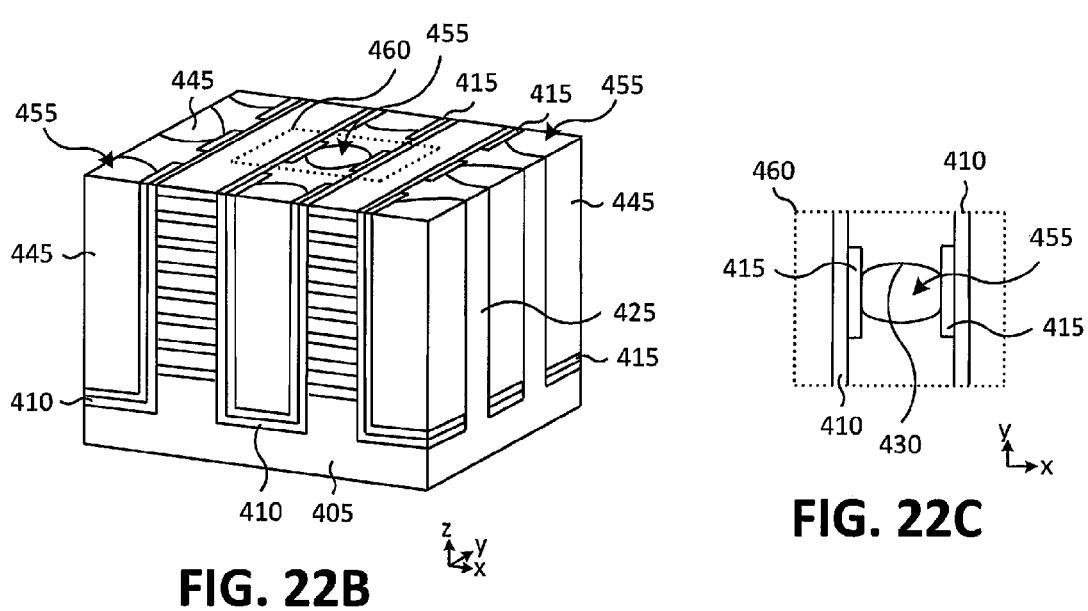
FIG. 22B
FIG. 22C

METHOD OF WORD-LINE FORMATION BY
SEMI-DAMASCENE PROCESS WITH THIN
PROTECTIVE CONDUCTOR LAYER

BACKGROUND OF THE INVENTION

1. Field of the Invention

The present invention relates generally to semiconductor fabrication methods and, more particularly, to reliable wordline formation in semiconductor memories.

2. Description of Related Art

Semiconductor structures such as memories are frequently organized with multiple parallel conducting paths, known as wordlines, oriented in a direction orthogonal to that of underlying bit lines. The wordlines are formed of conducting material and are electrically isolated from one another. During manufacture, care must be taken to maintain electrical separation of wordlines in the face of ever-shrinking semiconductor device dimensions. This required electrical separation may be compromised by the presence of undesired conducting paths, known as stringers, formed from residual conducting material remaining after performing etch steps to create the wordlines.

Methods for assuring wordline separation in manufacturing processes applicable to larger geometries generally do not scale to smaller geometries. Maintaining critical dimensions when wordline pitch is less than 40 nm is particularly difficult using prior art methods.

A need thus exists in the prior art for a manufacturing method of reliable wordline formation applicable to small geometries.

SUMMARY

The present disclosure addresses this need, for example, by providing a semiconductor structure that includes a storage layer, and a thin protective conductive layer that protects the storage layer, with both the storage layer and the protective layer being disposed above a substrate. The layers may be patterned, for example, and etched, to create openings that expose portions of the substrate. A dielectric material may be added, e.g., filled, in the openings. A contact may be formed between the openings, wherein the contact comprises the thin storage layer and the thin conductive layer.

In one example, a bowl-shaped profile may be created in the dielectric material, whereby formation of stringers does not occur.

In one example, the providing step includes providing a sacrificed layer disposed above the substrate. The sacrificed layer may include ceramic material. In one example, the present method further comprises removing material (sacrificed material) from the sacrificed layer.

In one example, the bowl-shaped profile may be filled with conducting material, whereby the thin protective layer connects with the conducting material. A hard mask may then be deposited and a wordline etch performed, wherein stringers, that is, undesired conducting path(s), are not present.

In one example, the providing of conducting material comprises providing polycrystalline silicon, the providing of a sacrificed layer comprises providing silicon nitride (SIN), and the providing of a dielectric layer comprises providing buffer oxide. The term "buffer oxide" as used herein may refer to a thin oxide layer which is provided or inserted between the sacrificed layer, e.g., silicon nitride, and the conducting material, e.g., polycrystalline silicon, for better adhesion and/or to provide protection for the underlying thin conducting layer during sacrificed layer (silicon nitride) removal.

In one example, the providing of conducting material may comprise providing one or more of tungsten silicide, cobalt silicide, and titanium nitride.

The patterning, e.g., etching, of the layers may comprise performing a BDF etch, that is an etch to define the length of the storage layer and buried diffusion (referred to herein as BDF), and the openings may be filled-in with BD oxide, which refers to an oxide insulator which is filled into the profile defined by the BDF etch. The creating of the bowl-shaped profile may comprise using diluted hydrofluoric acid (HF) to pull back the BD oxide and/or to remove buffer oxide.

While the present, semiconductor structure, and method have or will be described for the sake of grammatical fluidity with functional explanations, it is to be expressly understood that the claims, unless indicated otherwise, are not to be construed as limited in any way by the construction of "means" or "steps" limitations, but are to be accorded the full scope of the meaning and equivalents of the definition provided by the claims under the judicial doctrine of equivalents.

Any feature or combination of features described or referenced herein are included within the scope of the present invention provided that the features included in any such combination are not mutually inconsistent as will be apparent from the context, this specification, and the knowledge of one skilled in the art. In addition, any feature or combination of features described or referenced may be specifically excluded from any embodiment of the present invention. For purposes of summarizing the present invention, certain aspects, advantages and novel features of the present invention are described or referenced. Of course, it is to be understood that not necessarily all such aspects, advantages or features will be embodied in any particular implementation of the present invention. Additional advantages and aspects of the present invention are apparent in the following detailed description and claims that follow.

BRIEF DESCRIPTION OF THE DRAWINGS

FIG. 22A defines a location of a phantom plane that locates a cross-section of the structure of FIG. 21 for presentation in FIG. 22B;

FIG. 22B illustrates, in a perspective view, a cross-section of the structure of FIG. 21 taken along the phantom plane of FIG. 22A;

FIG. 22C shows detail of a portion of the cross-section of FIG. 22B;

DETAILED DESCRIPTION OF THE INVENTION

Figure 1:
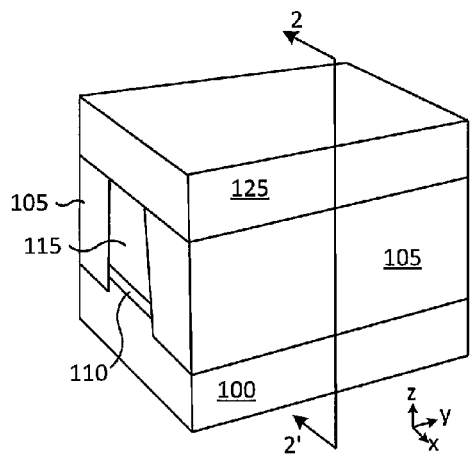
FIG. 1 is a perspective illustration of a portion of a semiconductor structure at an intermediate stage of manufacture according to the prior art.

Examples are now presented and illustrated in the accompanying drawings, instances of which are to be interpreted to be to scale in some implementations while in other implementations, for each instance, not. In certain aspects, use of like or the same reference designators in the drawings and description refers to the same, similar or analogous components and/or elements, while according to other implementations the same use should not. According to certain implementations, use of directional terms, such as, top, bottom, left, right, up, down, over, above, below, beneath, rear and front, are to be construed literally, while in other implementations the same use should not. The examples may be practiced in conjunction with various integrated circuit fabrication and other techniques that are conventionally used in the art, and only so much of the commonly practiced process steps are included herein as are necessary to provide an understanding of the examples presented. The examples described herein have applicability in the field of semiconductor devices and processes in general. For illustrative purposes, however, the following description pertains to semiconductor memory circuits and a related method of manufacture.

Referring more particularly to the drawings, FIG. 1 is a perspective view of a portion of a prior-art semiconductor structure at a manufacturing stage preparatory to formation of wordlines. The diagram includes x-y-z axes that may be used for spatial reference in this and other figures presented herein. The illustrated structure includes an oxide-nitride-oxide (ONO) layer 110 formed on a silicon substrate 100, the ONO layer 110 being disposed under a polysilicon conducting structure 115 (PL1). PL1 115 and the ONO layer 110 are bounded by an oxide layer 105 The ONO layer 110, PL1 115 and oxide layer 105 structures extend in a y-direction. The PL1 115 and oxide 105 structures are covered with a polysilicon overlay 125 (PL3).

Figure 2:
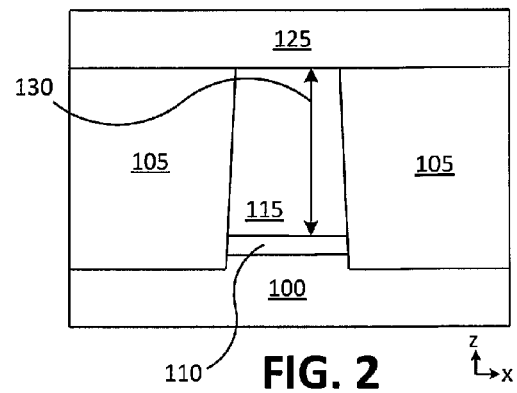
FIG. 2 is a cross-section of the structure of FIG. 1 taken along a line 2-2'.

FIG. 2 is a cross-sectional view of the prior-art structure of FIG. 1 taken along a line 2-2'. The cross-section of the PL1 115 structure has a tapered shape, the shape being narrower at the top thereof than at the bottom where the PL1 115 meets the ONO layer 110.

Figure 3:
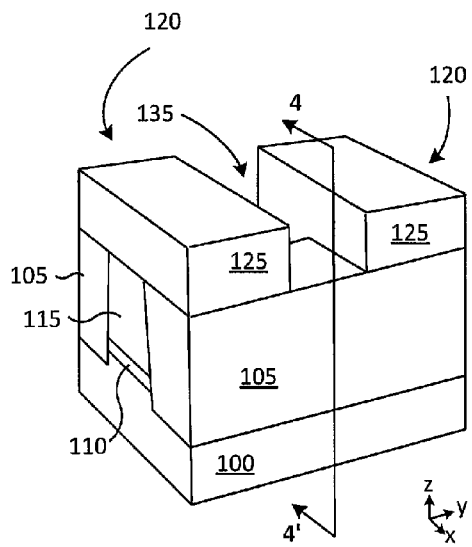
FIG. 3 is a perspective view of the structure of FIG. 1 after performance of a wordline etch.

FIG. 3 is a perspective view of the structure of FIG. 1 after a wordline etch that removes a portion of the PL1 115 and the PL3 125 from the structure. Illustrated wordlines 120, which are formed from remaining material of the PL3 125 and remaining material of the PL1 115 and separated by a space 135, are intended to provide parallel conducting paths that provide electrical connections between external read/write hardware (not shown) and the ONO layer 110. The wordlines 120 are required to be electrically isolated from each other.

Figure 4:
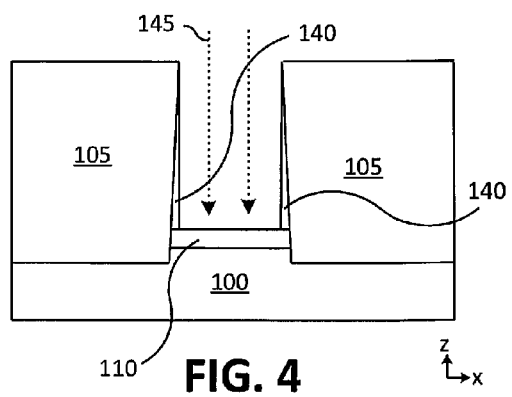
FIG. 4 illustrates formation of stringers in a cross-sectional view of the structure of FIG. 3 taken along the line 4-4' after completion of the wordline etch.

FIG. 4 illustrates a result of the wordline etch viewed in an x-z plane corresponding to the line 4-4' (FIG. 3). The wordline etch, which may be an anisotropic etch as represented by dotted arrows 145, removes portions of the PL3 125 as well as a substantial portion of the PL1 115 in a region defined by the space 135 (FIG. 3), but may leave behind polysilicon material known as stringers, such as stringers 140, on sidewalls of the space vacated by the PL1 115. The stringers 140 can provide unwanted conduction paths between parallel wordlines spaced in the y-direction (cf. FIG. 3), thereby creating serious defects that may create random single-bit errors in a memory product so affected.

Figure 5:
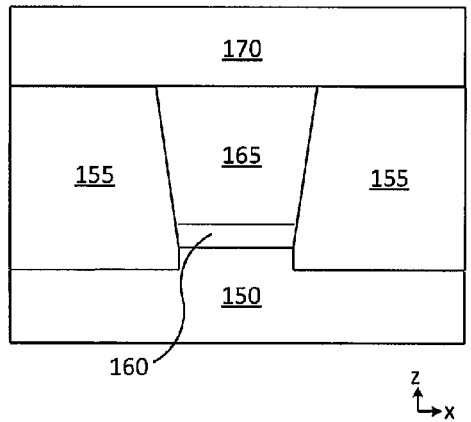
FIG. 5 is a cross-section similar to that of FIG. 2 having a reentrant profile intended to prevent formation of stringers.
Figure 6:
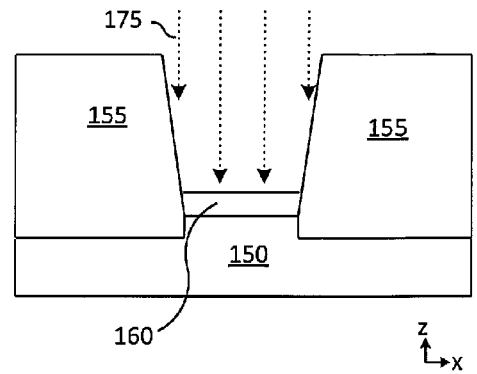
FIG. 6 illustrates the cross-section of FIG. 5 after a wordline etch demonstrating an absence of stringers.

One prior-art approach to eliminating stringers is to change a profile of the PL1 115 (FIG. 2) to have a reentrant cross-section as illustrated by a PL1 165 in FIG. 5. By reentrant is meant that the sidewalls of the PL1 165 slope inwardly at the bottom of the profile of the PL1 165. The structure of FIG. 5 includes a substrate 150, an ONO layer 160, oxide 155 and an overlying PL3 170. When an anisotropic etch 175 that removes polysilicon is applied to the structure of FIG. 5 as shown in FIG. 6, no stringers remain. However, an upper dimension (measured in the x-direction) of the PL1 165 is increased relative to a corresponding dimension in the structure of FIG. 2, a change that can lead to instability in cell critical dimension (CD).

Figure 7:
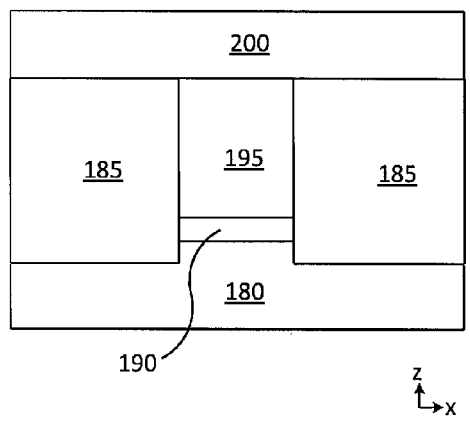
FIG. 7 is a cross-section similar to that of FIG. 2, but illustrating a vertically-sided profile.
Figure 8:
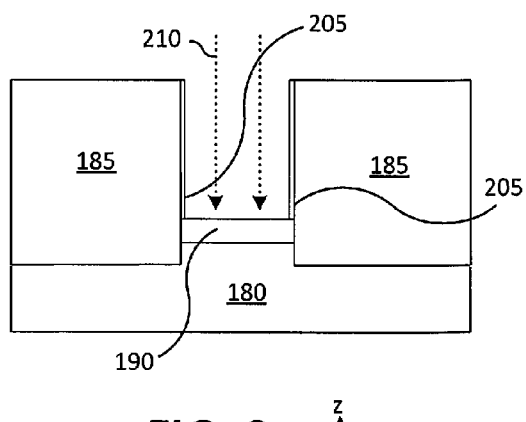
FIG. 8 describes an effect of performing a wordline etch on the structure of FIG. 7, illustrating stringers.
Figure 9:
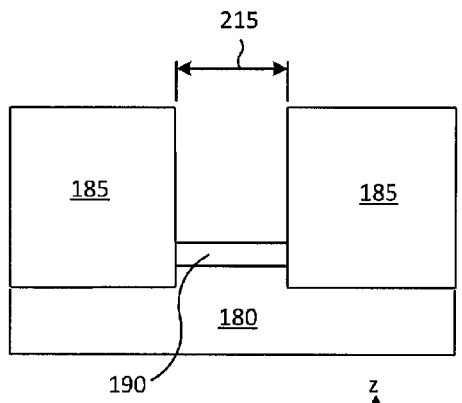
FIG. 9 identifies a critical dimension affected by an overetch intended to remove stringers from the structure of FIG. 8.

A prior-art approach to mitigating the CD instability problem associated with the reentrant profile of FIGS. 5 and 6 is to create a vertical profile as illustrated in FIG. 7. The structure illustrated in FIG. 7 is similar to those of FIGS. 1-6, comprising a substrate 180, an oxide layer 185, an ONO layer 190, a PL1 195 having the vertical profile, and a polysilicon overlay PL3 200. Although performing a wordline etch 210 to remove portions of the PL3 200 and the PL1 195 may leave stringers 205 on sides of the space vacated by the etch, this excess polysilicon may be removed by performing an isotropic over-etch. The over-etch can, however, cause a loss of cell CD, corresponding to, for example, a line width 215 in FIG. 9, a loss that cannot be tolerated when the wordline pitch shrinks to about 40 nm or less.

The prior-art methods described above share a common approach, that of first depositing a polysilicon layer (e.g., PL1 115, 165, and 195, and PL3 125, 170, and 200 in respective FIGS. 2, 5, and 7) and then etching to remove portions of the polysilicon in a wordline etch, as illustrated in FIGS. 3, 4, 6, and 8.

The present invention provides a novel approach to wordline formation, which approach may be referred to as a semi-damascene method of wordline formation, whereby openings are first created in a dielectric material (e.g., oxide) and then filled with polysilicon before etching to create wordlines.

One example of a method in accordance with the present invention may be described by referring to FIGS. 10-16.

Figure 10:
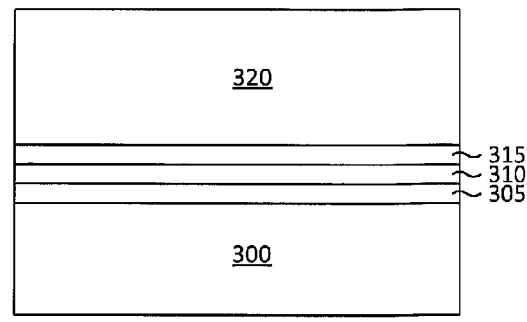
FIG. 10 is a cross-section showing a semiconductor film stack suitable for fabrication of a semiconductor structure, the layers including a thin protective conducting layer, a buffer oxide layer and a silicon nitride (SIN) layer.

FIG. 10 illustrates a collection of layers of materials well-known in the art of semiconductor manufacture viewed in cross-section along a y-axis (not visible) in an x-z plane. The layers, formed on a substrate 300, such as a silicon substrate, comprise a thin storage layer 305, which may be formed, for example, of oxide-nitride-oxide (ONO), overlying the substrate 300. The storage layer 305 has disposed thereon a thin protective layer, for example, a thin protective conducting layer 310, that is formed, for example, of polycrystalline silicon, titanium nitride, amorphous silicon and/or the like, effectively replacing the PL1 115/165/195 in the prior-art structures of FIGS. 1, 2, 3, 5, and 7. A dielectric layer 315, such as a layer of buffer oxide, may overlie the protective conducting layer 310, and a sacrificed layer 320 formed, for example, of ceramic material, such as silicon nitride (SIN) (e.g., $Si_3N_4$), may be disposed above the dielectric layer 315.

The storage layer 305, when formed of ONO, for example, may have a thickness in typical examples ranging from about 150 Å to about 250 Å with a typical value of about 180 Å. The protective conducting layer 310 may have a thickness in a range of about 100 Å to about 200 Å with a typical value being about 150 Å. The dielectric layer 315 may have a thickness between about 50 Å and about 150 Å, with a typical value of about 100 Å. The sacrificed layer 320, which may be used as a stop layer in later processing steps, may have a thickness in a range of about 300 Å to about 700 Å, with a typical value of about 500 Å.

Figure 11:
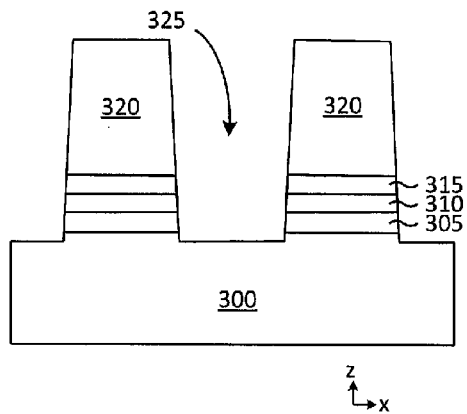
FIG. 11 shows an effect of performing a BDF etch on the semiconductor film stack of FIG. 10.

The layers are patterned, for example, and are subjected to etching, to create openings that expose portions of the substrate. In one example, a BDF etch using one or more etchants, such as CF4, CHF3, CH2F2, O2, N2, Ar, SF6, and the like may be performed on the layers 305/310/315/320 of FIG. 10 to create openings having a profile 325 as illustrated in FIG. 11. A reentrant profile is illustrated in FIG. 11. In other examples, the profile may not be reentrant.

The protective conducting layer 310 may be very thin when compared, for example, with the thickness 130 of the corresponding prior-art PL1 115 (FIG. 2), a property that may aid in maintaining cell critical dimension (CD) uniformity, as is described below with reference to FIG. 14.

Figure 12:
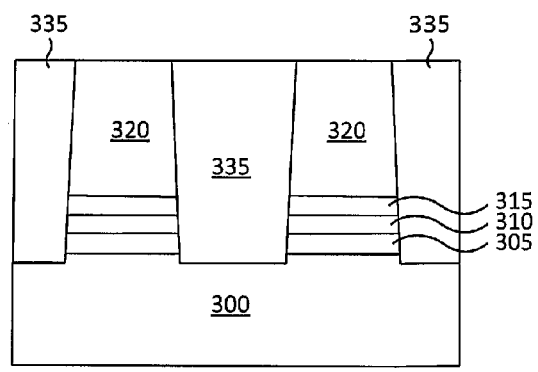
FIG. 12 illustrates deposition of a BD oxide and performance of chemical/mechanical planarization (CMP) on the structure of FIG. 11.
Figure 13:
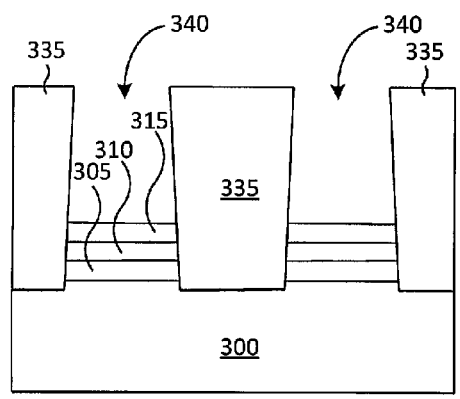
FIG. 13 describes the structure of FIG. 12 after an etch to remove SIN.

The structure of FIG. 11 may be filled-in (i.e., deposited) with a dielectric material, for example, BD oxide 335, and chemical mechanical planarization (CMP) may be employed to remove excess oxide. The CMP stops on the sacrificed layer 320 (e.g., SIN layer) as shown in FIG. 12. The sacrificed layer 320 then may be removed without damaging the oxide layer 335, the dielectric layer 315 or the thin protective conducting layer 310 by using, for example, hot phosphoric acid ($H_3PO_4$). FIG. 13 illustrates a result of removal of the sacrificed layer 320 whereby openings 340 are created between regions of BD oxide 335.

The shape of the openings 340 in FIG. 13 may then be modified by using diluted hydrofluoric acid (HF) to pull-back the BD oxide 335 and to remove the buffer oxide layer 315. A result of this pull-back and removal is illustrated in FIG. 14, wherein the thin protective conducting layer 310 remains substantially intact. That is, a width 330 (e.g., CD) of the protective conducting layer 310 may be well-controlled (i.e., approximately or substantially unaffected or only slightly affected by the removal of the sacrificed layer 320, the BD oxide 335, and the buffer oxide layer 315) when compared, for example, with an effect on the corresponding CD 215 in the prior art embodiment illustrated in FIG. 9. In examples, the profile 325 illustrated in FIG. 11 may not be reentrant, and the width 330 may be greater than a width 331 of the storage layer 305.

Figure 14:
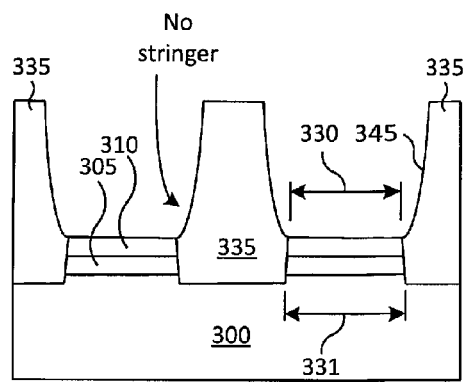
FIG. 14 illustrates an effect of an etch to pull-back BD oxide and remove buffer oxide, the effect producing a bowl-shaped profile.
Figure 15:
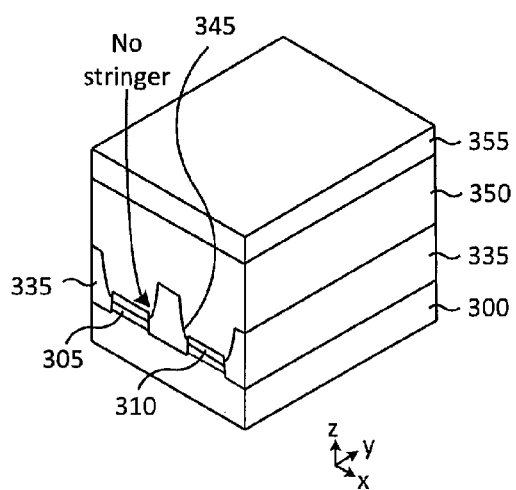
FIG. 15 is a perspective view of an effect of fill-in with polysilicon and deposition of a hard mask layer on the structure of FIG. 14.

A perspective view of the structure of FIG. 14 is illustrated in FIG. 15 where the structure has been modified by filling-in with polysilicon 350 and by overlaying a hard mask layer 355 formed of, for example, oxide, nitride, oxy-nitride ($SiO_xN_y$, DARC), ACL (amorphous carbon layer), other materials which have high endurance during polysilicon etch, and the like.

Figure 16:
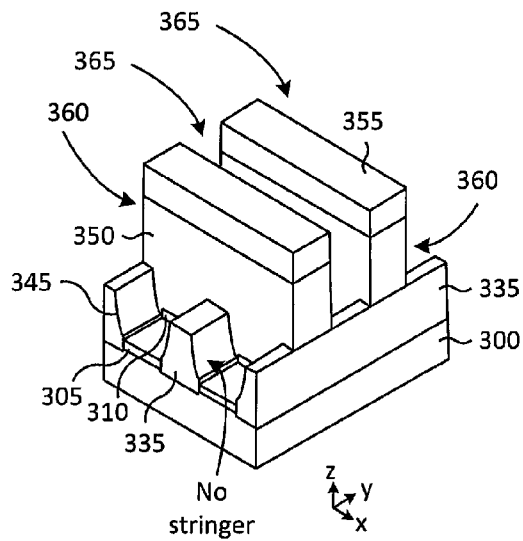
FIG. 16 portrays a result of a wordline etch on the structure of FIG. 15 in a perspective view.

Wordlines 360 may be formed in the structure of FIG. 15 as illustrated in FIG. 16 by patterning and performing a wordline etch that removes hard mask material 355 and polysilicon material 350 to create a space 365 that defines wordlines 360 formed of remaining polysilicon material 350. The polysilicon 350 of the wordlines makes electrical contact with the thin protective conducting layer 310. In this manner, the thin protective conducting layer 310 becomes part of the wordlines 360 thereby providing a conducting path between external read/write hardware (not shown) and the storage layer 305. This conducting path may be electrically identical to that provided by wordlines 120 in, for example, the prior art structure of FIG. 3, but without stringers, a consequence of the introduction of the bowl-shaped profile 345 shown in FIGS. 14, 15, and 16. Accordingly, a high over-etch to remove stringers is not required, and polysilicon loss in the bowl-shaped profile is minimized, thereby controlling (i.e., stabilizing and maintaining) the width 330, which may represent a critical dimension (CD) (FIG. 14).

Other examples, which may be similar, but not identical, to the structure of FIG. 14, may comprise a memory device having an additional conducting layer (e.g., a floating gate (FG)) disposed between the storage (e.g., ONO) layer 305 and the substrate 300. A gate structure (e.g., a control gate) may be disposed over the storage layer 305. The control gate may comprise a conductive gate layer connected with, and forming an electrical connection with, the thin protective conducting layer 310. That is, the conductive gate layer and the thin protective conducting layer 310 may comprise a gate structure. As described herein, the gate structure may comprise a damascene structure.

The semi-damascene approach to wordline formation, for example, described herein may integrate into standard (e.g., prior art) processes in a straightforward manner tabulated in Table 1. As is presented in Table 1 below, an etch process used in PL1 formation (cf. FIGS. 1-9) is replaced by a damascene process (cf. the gate structures illustrated in FIGS. 10-15 and modifications thereof described above), and wordline formation employs an etch step (cf. FIG. 16) in a manner similar to that of standard methods (cf. FIG. 3). In other respects, the semi-damascene approach is similar in important ways to standard processes for wordline formation. Consequently, introducing the semi-damascene approach into existing process flows may advantageously be accomplished with minimal disruption to established practices.

TABLE 1

| | Approaches to Wordline Formation | | |
| --- | --- | --- | --- |
| | STD | Damascene | Semi-Damascene |
| PL1 formation | Etch | Damascene | Damascene |
| WL formation | Etch | Damascene | Etch |
| Compatible to STD process flow | — | X | O |

TABLE 1-continued

Approaches to Wordline Formation

|  | STD | Damascene | Semi-Damascene |
|---|---|---|---|
| Difficulty and Complexity | — | High | ~STD |
| Cost compared to STD process | — | Higher | ~STD |

(1) —: Standard (STD) condition;
(2) ~STD: Close to standard condition;
(3) X: No (Needs many modifications); and
(4) O: Yes (compatible to STD process flow without any Modification).

Figure 17:
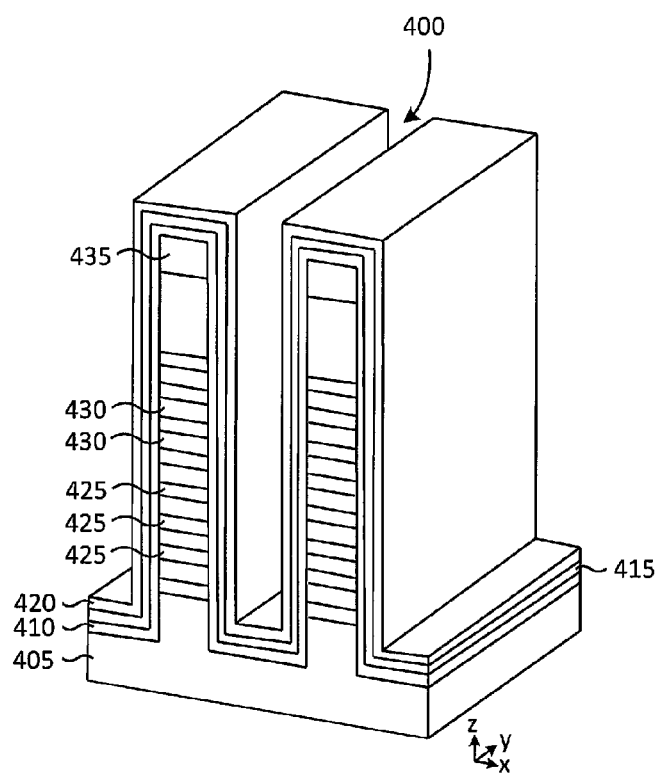
FIG. 17 illustrates a perspective view of a partially-formed semiconductor structure that includes an oxide-nitride-oxide (ONO) layer and multiple polysilicon layers separated by dielectric layers overlaid with a thin conducting layer and an oxide layer.
Figure 18:
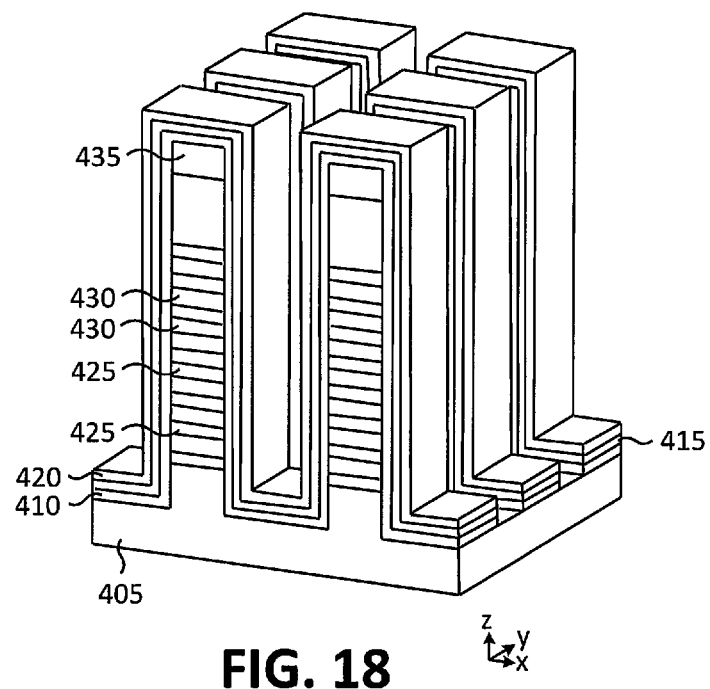
FIG. 18 describes a result of performing a wordline etch on the structure of FIG. 17.

Another example that may demonstrate utility of the method described herein is illustrated in FIGS. 17-22C. FIG. 17 is a perspective view of a semiconductor structure at an intermediate stage of manufacture comprising high-aspect-ratio trenches 400 extending in a y-direction formed from a semiconductor stack that may comprise, for example, a substrate 405 overlaid by alternating layers of polysilicon 425 and oxide 430, and a SIN layer 435. The structure may be overlaid with an ONO layer 410, a thin protective conducting layer 415, which may comprise polysilicon, and a dielectric (e.g., oxide) layer 420. An etch step (e.g., a wordline etch) of the polysilicon/oxide may be performed in an x-direction to form a structure as illustrated in FIG. 18. The structure of FIG. 18 may be filled-in with oxide 440, with excess oxide 440 being removed by CMP, to yield the structure of FIG. 19 in which the oxide layer 420 effectively becomes part of the filled-in oxide 440. In the present example, a portion of the oxide layer 420 lying at the top surface of the structure of FIG. 18 is removed by the CMP process, which stops when the thin protective layer 415 is reached.

Figure 19:
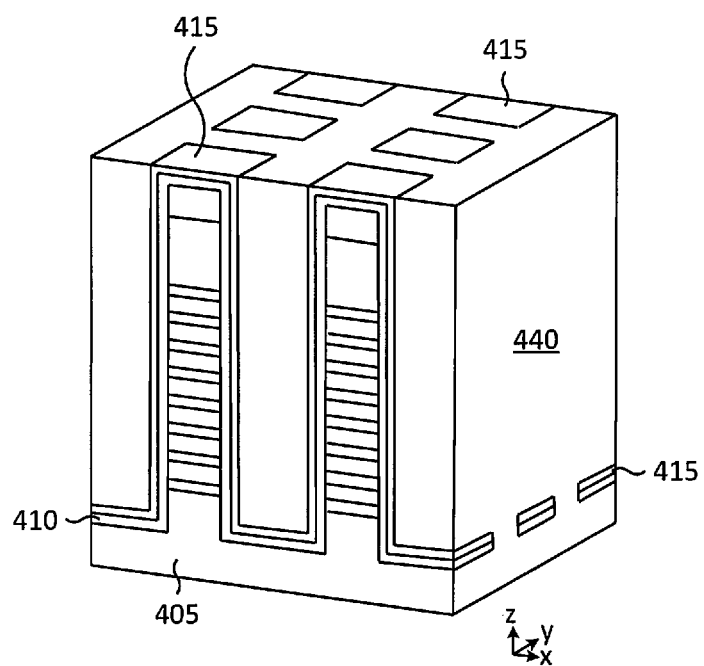
FIG. 19 shows a result of oxide fill-in and CMP on the structure of FIG. 18.
Figure 20:
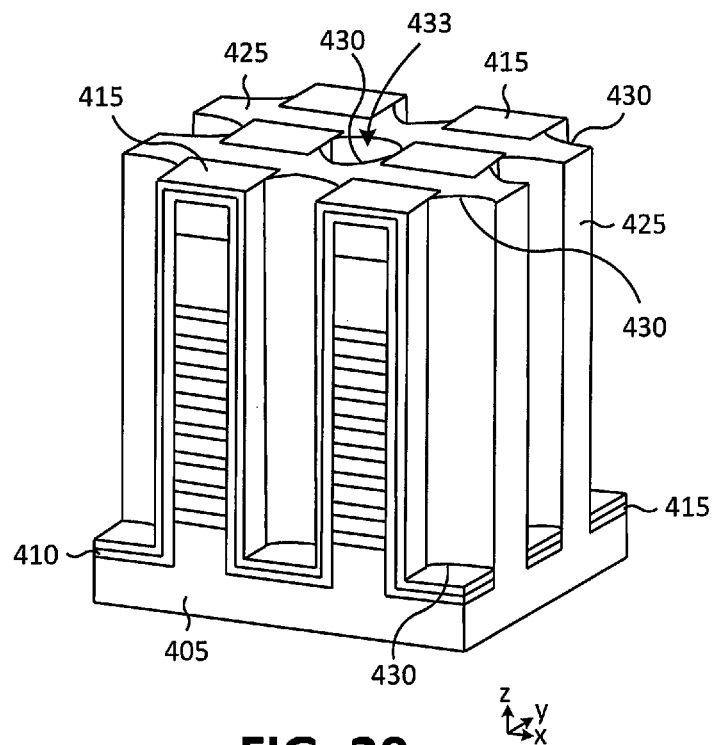
FIG. 20 describes a result of a damascene etch on the structure of FIG. 19, illustrating protection of the ONO layer by the thin protective conducting layer.

A damascene etch performed on the structure of FIG. 19 may remove oxide material 440 to form the structure shown in FIG. 20, wherein the thin protective conducting layer 415 protects the ONO layer 410 from being damaged during the etch. The resulting structure includes openings 433 (only one of which is illustrated in FIG. 20 for simplicity) in the oxide 440 formed by curved profiles 430 that may be analogous to the bowl-shaped profile 345 of FIGS. 14-16.

Figure 21:
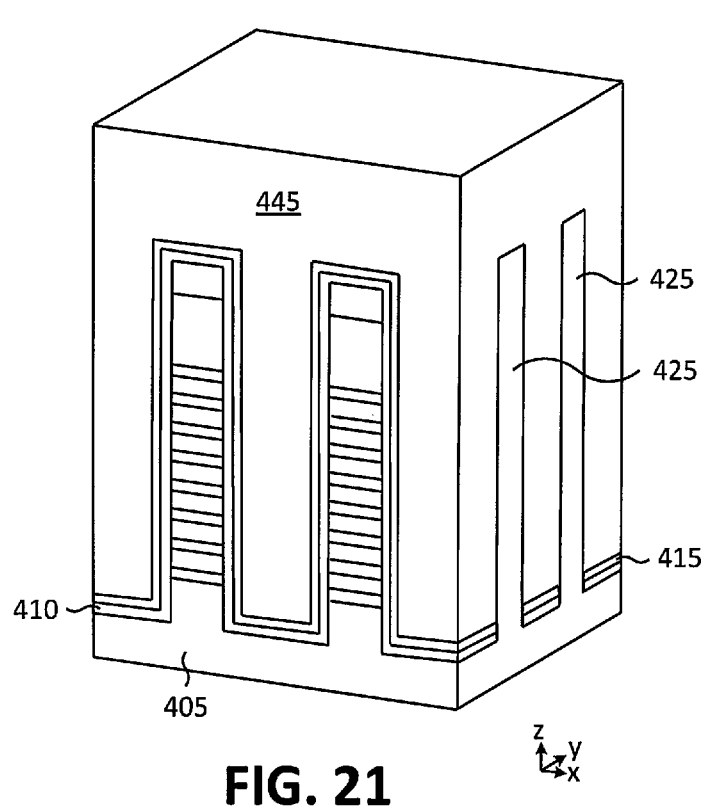
FIG. 21 is a perspective view of an effect of fill-in of the structure of FIG. 20 with polysilicon.

Subsequently, the structure of FIG. 20 may be filled-in with polysilicon 445 as shown in FIG. 21. An internal view of the structure of FIG. 21 may be seen by slicing the structure with a phantom x-y plane 450 (FIG. 22A). When the portion of FIG. 22A above the plane 450 is removed, a bottom portion of the structure may appear as shown in FIG. 22B. The fill-in with polysilicon is noted to form polysilicon plugs 455. A detailed representation of a portion 460 of the structure of FIG. 22B viewed in a z-direction, i.e., in an x-y plane, is shown in FIG. 22C. The structure is noted to comprise a polysilicon plug 455 that makes electrical contact with a winged ONO strip 410 through the thin protective conducting layer 415.

Figure 24:
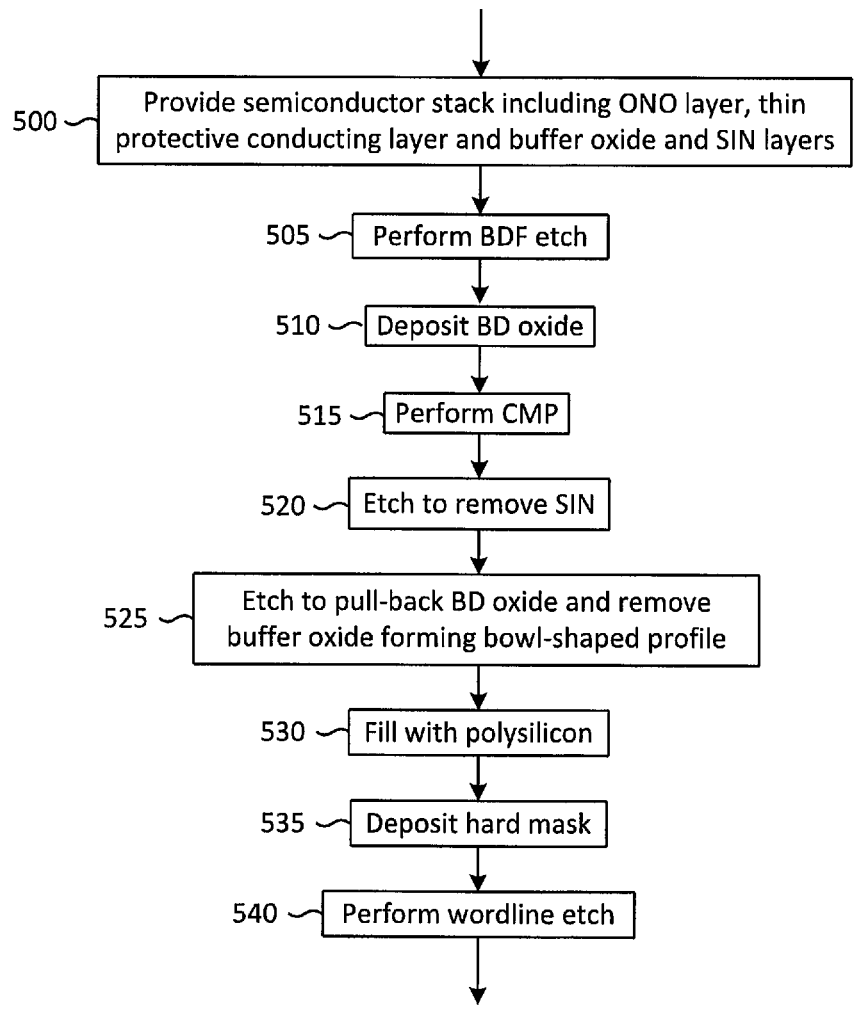
FIG. 24 is a flowchart illustrating an implementation of a method described herein.

One implementation of the method described herein may be summarized in a flowchart as illustrated in FIG. 24. The implementation described in the figure commences at step 500 by providing a semiconductor stack that includes a storage layer formed over a substrate. A thin protective conducting layer may overlie the storage layer, and additional layers of dielectric and ceramic material may be disposed above the storage layer. An example of such a semiconductor stack is shown in FIG. 10, describing a storage layer 305 (e.g., a charge storage layer) formed of, for example, oxide-nitride-oxide (ONO) disposed on a substrate 300 with a thin protective conducting layer 310 of, for example, polycrystalline silicon that overlies the storage layer 305. A dielectric layer of buffer oxide 315 is deposited on the protective conducting layer 310, and a sacrificed layer 320 is overlaid onto the buffer oxide layer 315. The sacrificed layer 320 comprises, according to one example, silicon nitride (e.g., $Si_3N_4$).

A BDF etch, which may employ (an) etchant(s) such as CF4/CHF3/CH2F2/O2/N2/Ar/SF6 and the like, may be performed at step 505 on the semiconductor stack in order to form openings into which polysilicon may be deposited in a later step. An exemplary result of such an etch is illustrated in FIG. 11, wherein openings 325 are formed. Dielectric material such as BD oxide 335 (FIG. 12) may be deposited over the structure at step 510, thereby filling in the openings 325; CMP may be performed at step 515 to remove excess BD oxide, the CMP operation stopping when the sacrificed layer 320 is reached.

Referring to FIG. 13, remaining portions of the sacrificed layer 320 may be removed at step 520 by etching with hot phosphoric acid ($H_3PO_4$). The removal may create openings 340 that expose the buffer oxide layer 315 without damaging the buffer oxide layer 315, the protective conducting layer 310, or the storage layer 305.

The openings 340, which may have, for example, a straight-sided, reentrant, or tapered profile, may be modified by pulling back the BD oxide using diluted hydrofluoric acid (HF) at step 525. The storage layer 305 (e.g., an ONO layer) may be protected during this operation by the thin protective conducting layer 310 (e.g., a polysilicon layer).

The structure so formed then may be filled-in with conducting material (e.g., polysilicon) 350 (FIG. 15) at step 530, and a hard mask 355, which may comprise, for example, such materials as identified previously, may be deposited over the layer of conducting material 350 at step 535.

A wordline etch may be performed at step 540 using etchant(s) such as HBr/Cl2/O2/N2/Ar and the like as illustrated, for example, in FIG. 16. As a high over-etch is not required to remove polysilicon stringers, loss of wordline polysilicon may be minimized by this process.

Figure 23:
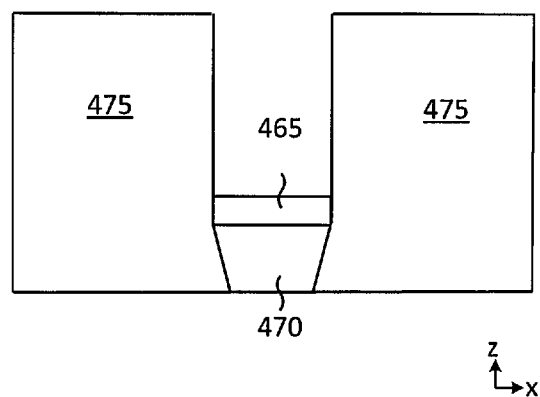
FIG. 23 is a cross-sectional view of a semiconductor structure employing titanium nitride (TiN) as a thin protective conducting layer.

Although the disclosure herein refers to certain illustrated embodiments, it is to be understood that these embodiments have been presented by way of example rather than limitation. In particular, the thin protective conducting layer described above may be replaced by other conducting materials. For example, the thin protective conducting layer may comprise tungsten silicide (WSi) or cobalt silicide (CoSi) in front-end-of-line (FEOL) and/or middle-end-of-line (MEOL) processes. In back-end-of-line (BEOL) applications, the protective conducting layer may comprise titanium nitride (TiN) as described in FIG. 23, which illustrates a thin protective conducting layer of TiN 465 overlaying a layer 470 formed, for example, of any metal used in semiconductor manufacturing, such as AlCu, Cu, W, Co, Ni, and the like and bounded by oxide material 475. In other examples, the thin protective conducting layer may be formed of polysilicon and/or amorphous silicon.

It will be evident to one skilled in the art that any damascene process having a thin conductor existing before damascene formation with the thin conductor subsequently connecting to filled material is included in the scope of the description provided herein. Further, the semi-damascene process referred to above may be used with any semiconductor structure, including such examples as a line pattern, a hole pattern, a self-aligned contact and/or a vertical device structure. The intent accompanying this disclosure is to have such embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention as limited only by the appended claims.

What is claimed is:

1. A memory device, comprising:
   a substrate;
   a charge storage layer disposed over the substrate; and
   a gate structure disposed over the charge storage layer;
   wherein the gate structure comprises a protective conductive layer and a conductive gate layer;
   the protective conductive layer comprises a plurality of layer portions separated by regions of dielectric material, wherein
   one or more of the regions of dielectric material has at least one bowl-shaped profile.

2. The memory device of claim 1, wherein the protective conducting layer comprises material selected from the group consisting of titanium nitride, polysilicon, and amorphous silicon.

3. The memory device of claim 1, wherein a width of the gate structure is greater than a width of the charge storage layer.

4. The memory device of claim 1, which further comprises a word line structure connected to the gate structure.

5. The memory device of claim 4, wherein the gate structure comprises a damascene structure.

6. The memory device of claim 5, wherein the charge storage layer is formed of a dielectric material.

7. The memory device of claim 1 wherein the at least one bowl shaped profile mitigates against the presence of stringers.

8. The memory device of claim 1 which is produced without employing an over-etch to remove stringers.

* * * * *